US009073385B2

(12) United States Patent
Okita et al.

(10) Patent No.: US 9,073,385 B2
(45) Date of Patent: Jul. 7, 2015

(54) PLASMA PROCESSING METHOD FOR SUBSTRATES (75) Inventors: Shogo Okita, Hyogo (JP); Ryota Furukawa, Osaka (JP); Yoshimasa Inamoto, Kyoto (JP); Tatsuhiro Mizukami, Saga (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 21 days.

(21) Appl. No.: 13/823,955

(22) PCT Filed: Sep. 29, 2011

(86) PCT No.: PCT/JP2011/005501
§ 371 (c)(1),
(2), (4) Date: Mar. 15, 2013

(87) PCT Pub. No.: WO2012/046418
PCT Pub. Date: Apr. 12, 2012

(65) Prior Publication Data
US 2013/0168353 A1 Jul. 4, 2013

(30) Foreign Application Priority Data

Oct. 8, 2010 (JP) ................. 2010-228621
Jan. 26, 2011 (JP) ................. 2011-014335

(51) Int. Cl.
*H01L 21/67* (2006.01)
*B44C 1/22* (2006.01)
(Continued)

(52) U.S. Cl.
CPC .......... *B44C 1/227* (2013.01); *H01L 21/67069* (2013.01); *H01L 21/68742* (2013.01); *H01L 21/68771* (2013.01); *H01L 33/005* (2013.01)

(58) Field of Classification Search
CPC combination set(s) only.
See application file for complete search history.

(56) References Cited

U.S. PATENT DOCUMENTS

2001/0019472 A1* 9/2001 Kanno et al. ............. 361/234
2005/0057853 A1* 3/2005 Nakamura et al. ........ 360/125
(Continued)

FOREIGN PATENT DOCUMENTS

JP 8-236455 9/1996
JP 2004-079664 3/2004
(Continued)

OTHER PUBLICATIONS

Plummer et al. Silicon VLSI Technology, 2000 pp. 638-639.*
(Continued)

*Primary Examiner* — Duy Deo
*Assistant Examiner* — Erin Bergner
(74) *Attorney, Agent, or Firm* — Wenderoth, Lind & Ponack, L.L.P.

(57) ABSTRACT

A substrate placement process uses a tray in which a plurality of substrate receiving holes are provided to receive substrates and which has substrate support portions protruding from inner walls of the substrate receiving holes. The tray is placed onto a tray support portion of a substrate stage and places substrates onto substrate holding portions, respectively, so that edge portions of the substrates projected beyond end edges of the substrate holding portions and are apart from the substrate support portions. The first plasma processing process reduces internal pressure of a chamber and supplies a process gas thereto to fulfill plasma processing for the individual substrates. A second plasma processing process with the tray and the individual substrates placed on the substrate stage, reduces the internal pressure of the chamber and supplies a process gas to fulfill plasma processing so that by-products stuck to edge portions of the substrates and the substrate support portions due to the first plasma processing process are removed. By the removal of by-products stuck to the edge portions of the substrates and the tray during plasma processing, product quality is improved.

8 Claims, 10 Drawing Sheets (51) Int. Cl.
*H01L 21/687* (2006.01)
*H01L 33/00* (2010.01)

(56) References Cited

U.S. PATENT DOCUMENTS

| | | | |
|---|---|---|---|
| 2008/0017318 | A1 | 1/2008 | Kobayashi et al. |
| 2008/0050923 | A1* | 2/2008 | Kim et al. ................. 438/706 |
| 2008/0194111 | A1 | 8/2008 | Delgadino et al. |
| 2009/0255901 | A1* | 10/2009 | Okita et al. ................. 216/67 |
| 2009/0294060 | A1 | 12/2009 | Kobayashi et al. |
| 2010/0051584 | A1 | 3/2010 | Okita et al. |
| 2010/0140221 | A1 | 6/2010 | Kikuchi |
| 2010/0218786 | A1 | 9/2010 | Ogasawara et al. |
| 2011/0100555 | A1 | 5/2011 | Kobayashi et al. |
| 2012/0003837 | A1 | 1/2012 | Kobayashi et al. |
| 2012/0256363 | A1 | 10/2012 | Okita et al. |
| 2014/0020709 | A1 | 1/2014 | Kikuchi |

FOREIGN PATENT DOCUMENTS

| | | |
|---|---|---|
| JP | 2004-203675 | 7/2004 |
| JP | 2008-218997 | 9/2006 |
| JP | 2007-109771 | 4/2007 |
| JP | 2007-266466 | 10/2007 |
| JP | 2008-28140 | 2/2008 |
| JP | 2008-218997 | 9/2008 |
| JP | 2008-258491 | 10/2008 |
| JP | 2010-140944 | 6/2010 |
| JP | 2010-199475 | 9/2010 |

OTHER PUBLICATIONS

International Preliminary Report on Patentability issued Apr. 18, 2013 in International (PCT) Application No. PCT/JP2011/005501, together with English translation.

International Search Report (ISR) issued Dec. 27, 2011 in International (PCT) Application No. PCT/JP2011/005501.

Office Action and Search Report issued Jan. 7, 2015 in corresponding Chinese Application No. 201180048666.9 (with English translation).

* cited by examiner

PLASMA PROCESSING METHOD FOR SUBSTRATES

TECHNICAL FIELD

The present invention relates to a method for performing plasma processing on a plurality of substrates carried as they are received by a tray.

BACKGROUND ART

In a manufacturing process of LED devices, in order to improve the light extraction efficiency from the devices to the outside, it is practiced to execute etching process (plasma processing) as a step for forming a minor concavo-convex structure on a surface of a sapphire substrate. In such etching process, a plurality of substrates are treated as they are received by a tray (see, e.g., Patent Literature 1).

More specifically, a plurality of substrate receiving holes are formed in the tray, and an edge portion of each sapphire substrate is supported by a substrate support portion projected from an inner wall of each substrate receiving hole, thus allowing a plurality of substrates to be received by the tray. A substrate stage is placed in a chamber of the plasma processing apparatus, and a tray support portion and a plurality of substrate holding portions projecting upward from the tray support portion are provided on the top face of the substrate stage.

For execution of the etching process, a plurality of substrates are carried into the chamber as they are received by the tray, and the tray is placed on the tray support portion, so that the plurality of substrates are placed on the substrate holding portions, respectively, while edge portions of the substrates are set apart from the substrate support portions. In such a state, the individual substrates are electrostatically absorbed by ESCs (Electro-Static Chucks) contained in the substrate holding portions, and the etching process on the substrates is executed while the substrates are held by the substrate holding portions. Upon completion of the etching process, the absorption and holding by the ESCs is released, and the tray is lifted from the tray support portion while the edge portions of the substrates are supported again by the substrate support portions, in which state a plurality of substrates are carried out from within the chamber.

PATENT LITERATURE

Patent Literature 1: JP 2007-109771 A

DISCLOSURE OF INVENTION

Problems to be Solved by the Invention

However, with such an etching process method as in Patent Literature 1, edge portions of the substrates held on the individual substrate holding portions in the substrate stage, and the substrate support portions in the tray, are apart from each other. Therefore, by-products (deposits) generated from the sapphire substrates and the tray (formed of, e.g., SiC) during the etching process are stuck to the edge portions of the substrates and the inner walls of the substrate receiving holes of the tray. After completion of the etching process, lifting the tray from the tray support portion and carrying the individual substrates out may involve contact of the substrate holding portions of the tray and the edge portions of the substrates with each other, so that the sticking by-products may fall onto the substrate holding portions. With such fall of the by-products onto the substrate holding portions, there are some cases in which during the etching process on the next substrates, fallen by-products may bite into the substrates, causing impairment of secure holding of the substrates. In such a case, the substrates cannot be cooled enough during the etching process, posing a problem that product failures may occur.

Accordingly, an object of the present invention, lying in solving the above-described problems, is to provide a method for performing plasma processing on a plurality of substrates carried as the substrates are received by the tray, in which method by-products having stuck to edge portions of the substrates and to the tray during the plasma processing are removed so that product quality can be improved.

Means to Solving the Issue

In order to achieve the above object, the present invention has the following constitution.

According to a first aspect of the invention, there is provided a plasma processing method for substrates, comprising:

a substrate carrying-in process for, with use of a tray in which a plurality of substrate receiving holes are provided to receive substrates and which has substrate support portions protruding from inner walls of the substrate receiving holes, respectively, carrying a plurality of substrates into a chamber as the substrates are received by the substrate receiving holes, respectively, with edge portions of the substrates being supported by the substrate support portions;

a substrate placement process for, with respect to a substrate stage having a tray support portion and a plurality of substrate holding portions protruding upward from the tray support portion, placing the tray onto the tray support portion and placing the substrates onto the substrate holding portions, respectively, in the chamber, so that edge portions of the substrates projected from end edges of the substrate holding portions and the substrate supporting portions are apart from each other;

a first plasma processing process for supplying a process gas into the chamber and adjusting internal pressure of the chamber to perform plasma processing for the individual substrates;

a second plasma processing process for, with the tray and the individual substrates being placed on the substrate stage, supplying a process gas into the chamber and adjusting the internal pressure of the chamber to perform plasma processing so as to remove by-products stuck to the edge portions of the substrates and the substrate support portions due to execution of the first plasma processing process; and a substrate carrying-out process for, after completion of the second plasma processing process, carrying the tray and the individual substrates out of the chamber while the edge portions of the substrates are supported by the substrate support portions.

According to a second aspect of the present invention, there is provided the plasma processing method for substrates according to the first aspect, wherein after completion of the first plasma processing process, process gas is changed over to a process gas different in type from the process gas of the first plasma processing process in execution of the second plasma processing process, and the second plasma processing process is performed with a pressure higher than the pressure of the first plasma processing process.

According to a third aspect of the present invention, there is provided the plasma processing method for substrates according to the second aspect, wherein in the first plasma processing process, the individual substrates are absorbed and held by the substrate holding portions by electrostatic absorption and, while being cooled with a cooling gas supplied at a specified pressure to between the substrates and the substrate holding portions, subjected to plasma processing, and after completion of the first plasma processing process, in execution of the second plasma processing process, a drive voltage for electrostatic absorption is changed over to one lower than a drive voltage for electrostatic absorption of the first plasma processing process.

According to a fourth aspect of the present invention, there is provided the plasma processing method for substrates according to the third aspect, wherein in execution of the second plasma processing process, a process-gas pressure is changed over to one lower than the cooling-gas pressure of the first plasma processing process.

According to a fifth aspect of the present invention, there is provided the plasma processing method for substrates according to the forth aspect, wherein an electrostatic-absorption drive voltage for execution of the second plasma processing process, and a differential pressure between the internal pressure of the chamber and the cooling-gas pressure in the second plasma processing process, are equal to zero.

According to a sixth aspect of the present invention, there is provided the plasma processing method for substrates according to the third aspect, wherein sapphire substrates are used as the substrates, and a process of forming a minor concavo-convex structure on surfaces of the sapphire substrates is performed as plasma processing in the first plasma processing process.

According to a seventh aspect of the present invention, there is provided the plasma processing method for substrates according to the sixth aspect, wherein $BCl_3$ is used as the process gas in the first plasma processing process, and $O_2/CF_4$ is used as the process gas in the second plasma processing process.

According to an eighth aspect of the present invention, there is provided the plasma processing method for substrates according to any one of the third aspect to the seventh aspect, wherein after completion of the second plasma processing process, a charge-eliminating plasma is generated and a charge elimination process for reducing residual electrostatic absorption force between the substrates and the substrate holding portions is executed.

According to a ninth aspect of the present invention, there is provided the plasma processing method for substrates according to any one of the first aspect to the eighth aspect, wherein by-products removed in the second plasma processing process are accumulated on side surfaces of the substrate holding portions.

Effect of the Invention

According to the present invention, in the substrate placement step for placement of a plurality of substrate onto a substrate stage within the chamber, while substrate edge portions projected from end portions of the substrate holding portions are kept apart from the substrate support portions of the tray, the first plasma processing step is executed in that state, and thereafter by-products stuck to the substrate edge portions and the substrate support portions by the execution of the first plasma processing step can be removed by executing the second plasma processing step. Therefore, after that, when a plurality of substrates, as they are received by the tray, are carried out of the chamber with the substrate edge portions supported again on the substrate support portions of the tray, fall of by-products due to contact between the tray and the substrates can be prevented. Thus, product quality in the plasma processing method for substrates can be improved.

BRIEF DESCRIPTION OF DRAWINGS

These aspects and features of the present invention will become clear from the following description taken in conjunction with the preferred embodiments thereof with reference to the accompanying drawings, in which.

DESCRIPTION OF EMBODIMENTS

Before the description of the present invention proceeds, it is to be noted that like parts are designated by like reference numerals throughout the accompanying drawings. Hereinbelow, embodiments of the present invention will be described in detail with reference to the accompanying drawings.

Embodiment

Figure 1:
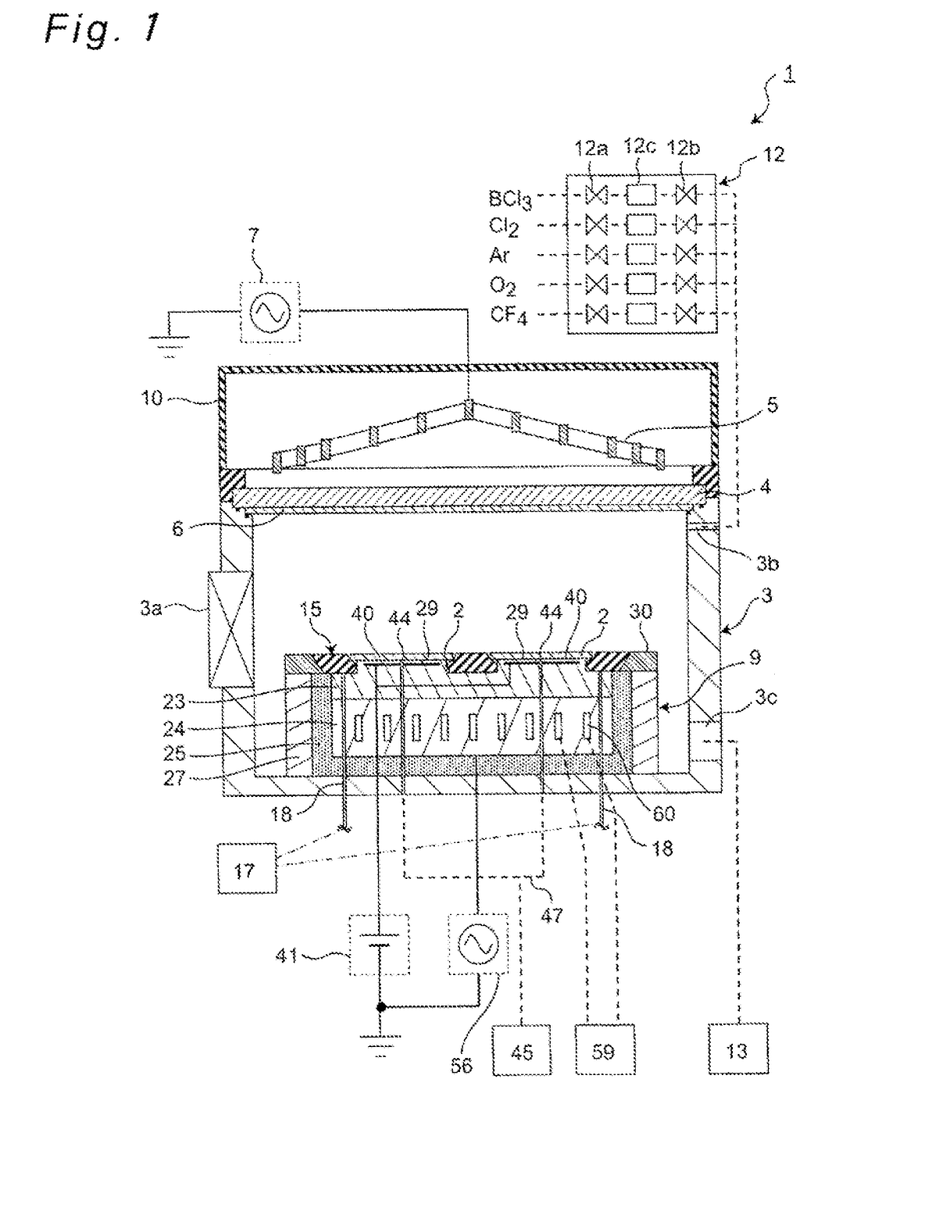
FIG. 1 is a structural view of a dry etching apparatus according to an embodiment of the present invention.

A structural view of an ICP (Inductively Coupled Plasma) type dry etching apparatus 1 is shown in FIG. 1 as an example of the plasma processing apparatus according to the invention.

The dry etching apparatus 1 includes a chamber (vacuum vessel) 3 having its interior forming a processing chamber for fulfilling plasma processing on substrates 2. An upper end opening of the chamber 3 is closed in a sealed state by a top plate 4 formed of a dielectric such as quartz. A lower surface side of the top plate 4 is covered with a top plate cover portion 6 formed of a dielectric. An ICP coil 5 is set on the top plate 4, and the ICP coil 5 is covered with a coil cover portion 10. A first high-frequency power supply section 7 including a matching circuit is electrically connected to the ICP coil 5. A substrate stage 9 having a function as a lower electrode to which a bias voltage is applied and a function as a holding plate for substrates 2 is placed on a bottom-portion side in the chamber 3 opposed to the top plate 4. In the chamber 3, for example, an openable/closable gate valve 3a for carrying-in and -out communicating with a load-lock chamber (not shown) is provided, so that the substrates 2 are held by hand portions included in an unshown carrying mechanism, and carrying-in and -out operations of the substrates 2 are performed through the open-state gate valve 3a. Also, a gas supply section 12 is connected to an etching-gas introducing port 3b provided in the chamber 3. The gas supply section 12 is equipped with supply lines for plural types of gases (e.g., $BCl_3$, $Cl_2$, Ar, $O_2$, $CF_4$), and opening/closing operations and degree of opening (aperture) of opening/closing valves 12a, 12b and a flow rate regulator 12c provided for each line of the individual gas types are selectively controlled, so that a process gas of a desired flow rate and specifications can be supplied through the gas introducing port 3b. Further, a pressure controller 13 made up of a vacuum pump, a pressure control valve or the like is connected to an exhaust port 3c provided in the chamber 3.

Next, a tray 15 for holding the substrates 2 to be treated by the dry etching apparatus 1 of this embodiment is described with reference to schematic perspective views of FIGS. 2 and 3.

The tray 15 includes a thin, disc-shaped tray body 15a. Materials of the tray 15 may be exemplified by ceramic materials such as alumina ($Al_2O_3$), aluminum nitride (AlN), zirconia (ZrO), yttria ($Y_2O_3$), silicon nitride (SiN), and silicon carbide (SiC), as well as metals such as aluminum coated with alumite, aluminum with its surface sprayed with ceramics, and aluminum coated with resin material. It is conceivable to adopt alumina, yttria, silicon carbide, aluminum nitride or the like for Cl-related processes, and quartz, crystals, yttria, silicon carbide, aluminum sprayed with alumite or the like for F-related processes. It is noted that the tray 15 formed with silicon carbide used as a main material is used in this embodiment.

Figure 4:
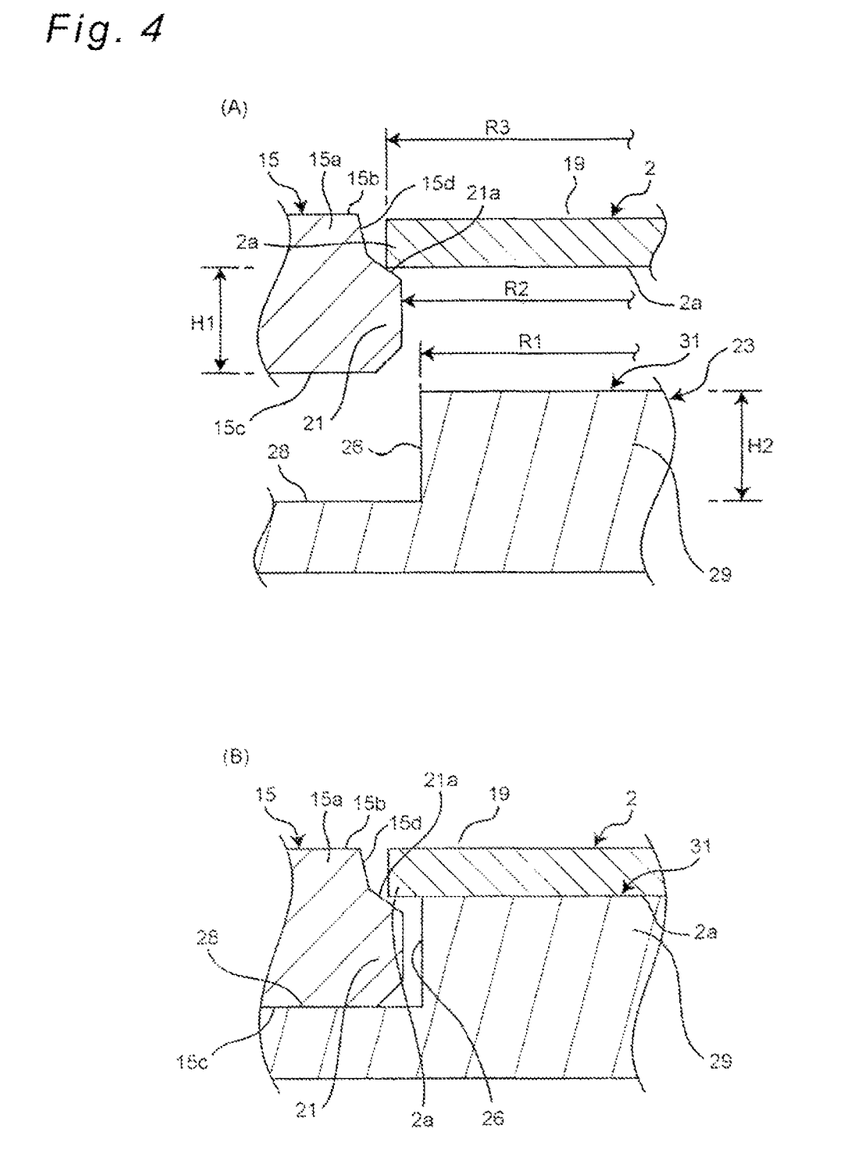
FIG. 4 includes sectional views showing a relationship among tray, substrates and stage upper portion.

Four substrate receiving holes 19 extending through thicknesswise from an upper surface 15b to a lower surface 15c are provided in the tray body 15a. The substrate receiving holes 19 are placed at equal angular intervals against a center of the tray body 15a as viewed from the upper surface 15b and the lower surface 15c. As shown in detail in FIGS. 4(A) and (B), a substrate support portion 21 protruding toward a hole center is provided in an inner wall 15d of each substrate receiving hole 19. In this embodiment, the substrate support portion 21 is provided all over the inner wall 15d and is annular-shaped in a plan view.

One substrate 2 is received by (in) each substrate receiving hole 19. The substrate 2 received by a substrate receiving hole 19 has a lower surface portion of its outer-peripheral edge portion 2a supported by an upper surface 21a of the substrate support portion 21. Further, since the substrate receiving hole 19 is formed so as to extend through the tray body 15a in its thicknesswise direction, the substrate 2 has its lower surface exposed from the substrate receiving hole 19 as viewed from the lower surface side of the tray body 15a.

In the tray body 15a, a notch 15e is formed as a partial cutout of the outer peripheral edge, so that an orientation of the tray 15 can be easily checked by using a sensor or the like in handling of the tray 15 during the carrying or the like.

Next, the substrate stage 9 is described with reference to FIGS. 1 to 3 and FIG. 4.

As shown in FIG. 1, the substrate stage 9 includes a stage upper portion 23 formed from a dielectric member of ceramics or the like, a metal block 24 formed from aluminum having its surface coated with alumite or the like and serving as a lower electrode to which a bias voltage is applied, an insulator 25, and a metallic shield 27. The stage upper portion 23 placed at the uppermost portion of the substrate stage 9 is fixed to an upper surface of the metal block 24, where outer peripheries of the stage upper portion 23 and the metal block 24 are covered with the insulator 25 and moreover an outer periphery of the insulator 25 is covered with the shield 27 formed from metal.

Figure 2:
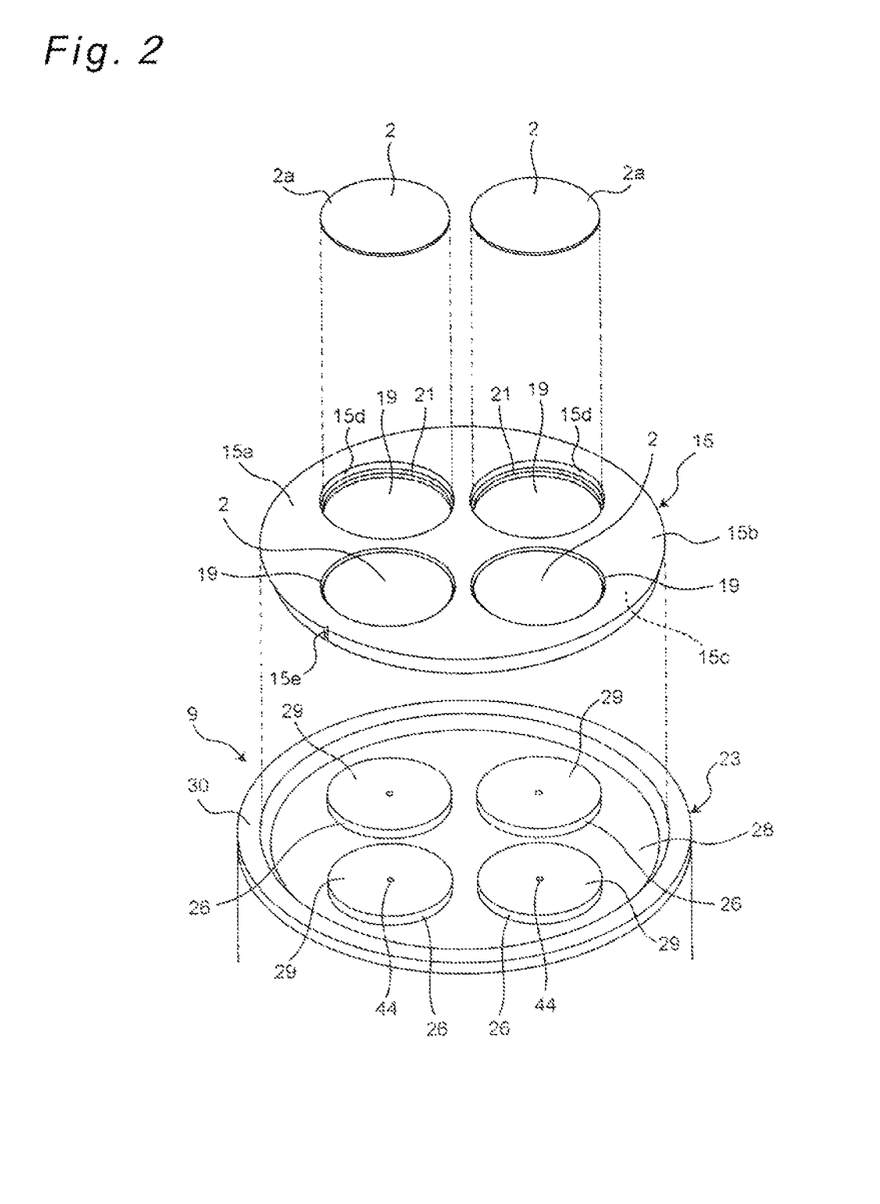
FIG. 2 is a perspective view of a tray, substrates and a substrate stage.
Figure 3:
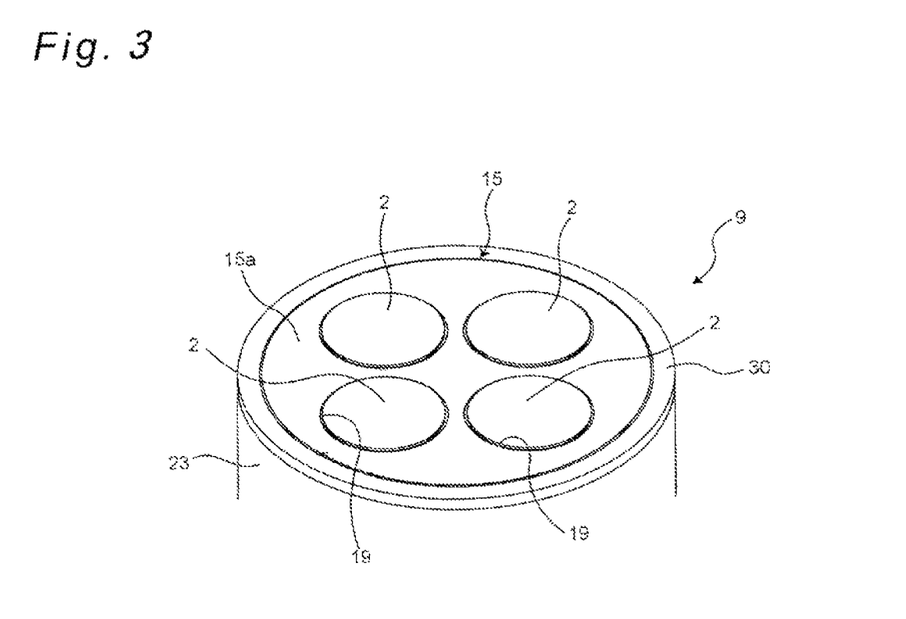
FIG. 3 is a perspective view of a tray, substrates and a substrate stage (tray placement state)

As shown in FIG. 2, the stage upper portion 23 is formed into a disc shape, and an upper end face of the stage upper portion 23 serves as a tray support portion 28 for supporting the lower surface 15c of the tray 15. Also, four short-columnar-shaped substrate holding portions 29 corresponding to the substrate receiving holes 19 of the tray 15, respectively, are protruded upward from the tray support portion 28. Further, on the stage upper portion 23, an annular guide ring 30 formed so as to protrude upward from the stage upper portion 23 is placed so as to surround the tray support portion 28. This guide ring 30 has a role of guiding a placement position of the tray 15 on the stage upper portion 23.

Now, relationships among the tray 15, the substrates 2, the substrate holding portions 29 and the like are explained with reference to FIGS. 4(A), (B). An outer diameter R1 of each substrate holding portion 29 is set smaller than an inner diameter R2 of an end face (inner-peripheral end face) of the substrate support portion 21. Therefore, with the tray 15 placed on the tray support portion 28, there is ensured a clearance between the substrate support portion 21 formed in the substrate receiving hole 19 and the substrate holding portion 29, the clearance preventing the two members from making contact with each other.

Also, a height H1 from the lower surface 15c of the tray body 15a to the upper surface 21a of the substrate support portion 21 is set lower than a height H2 from the tray support portion 28 to a holding surface 31 of the substrate holding portion 29. Therefore, with the lower surface 15c of the tray 15 placed on the tray support portion 28, the substrate 2 is pushed up by the holding surface 31 of the substrate holding portion 29, so that the substrate 2 comes to a state of being levitated from the substrate support portion 21 of the tray 15. In other words, when the tray 15 with the substrates 2 received by the substrate receiving holes 19 is placed on the stage upper portion 23, each substrate 2 received by its substrate receiving hole 19 is levitated from the upper surface 21a of the substrate support portion 21 so that an edge portion 2a of the substrate 2 and the upper surface 21a of the substrate support portion 21 are apart from each other, in which state the lower surface of the substrate 2 is placed on the holding surface 31 of the substrate holding portion 29. In addition, in a state that each substrate 2 is placed on its substrate holding portion 29 so as to be apart from the tray 15 as shown in FIGS. 3 and 4(B), the upper surface of the substrate 2 and the upper surface 15b of the tray 15 are positioned generally equal in height to each other.

Also, the outer diameter R1 of the substrate holding portion 29 is set smaller than an outer diameter R3 of the substrate 2. Therefore, in a state that the substrate 2 is placed on the substrate holding portion 29 so as to be apart from the tray 15, the edge portion 2a of the substrate 2 is protruded radially outwardly from the outer-peripheral end portion of the substrate holding portion 29 as shown in FIG. 4(B).

Also, as shown in FIG. 1, ESC electrodes (Electro-Statically Absorption Electrodes) 40 are contained in vicinities of the holding surfaces 31 of the individual substrate holding portions 29, respectively, provided in the stage upper portion 23. These ESC electrodes 40 are electrically insulated from one another, and a DC voltage for electrostatic absorption is applied from an ESC drive power supply section 41 containing a DC power supply.

As shown in FIG. 1, cooling-gas supply ports 44 are provided in the holding surfaces 31 of the substrate holding portions 29, respectively, and those individual cooling-gas supply ports 44 are connected to a common cooling-gas supply section 45 through cooling-gas supply paths 47. It is noted that in this embodiment, helium (He) is used as the cooling gas, and the cooling gas is supplied to between the holding surface 31 of each substrate holding portion 29 and the substrate 2 during plasma processing to fulfill the cooling of the substrate 2.

A second high-frequency power supply section 56 for applying a high-frequency voltage as a bias voltage is electrically connected to the metal block 24. The second high-frequency power supply section 56 includes a matching circuit.

Also in the metal block 24, refrigerant flow passages 60 for cooling the metal block 24 are provided, and a refrigerant controlled in temperature by a cooling unit 59 is supplied to the refrigerant flow passages 60, by which the metal block 24 is cooled.

As shown in FIG. 1, the substrate stage 9 includes a plurality of tray pushing-up rods 18 for pushing (thrusting) up the tray 15 placed on the tray support portion 28 from the lower surface side of the tray 15 to move up the individual substrates 2 together with the tray 15. The individual tray pushing-up rods 18 are driven to move up and down by a drive mechanism 17 between a pushed-up position protruded from the upper surface of the tray support portion 28 and a storage position for storage in the tray support portion 28.

Figure 5:
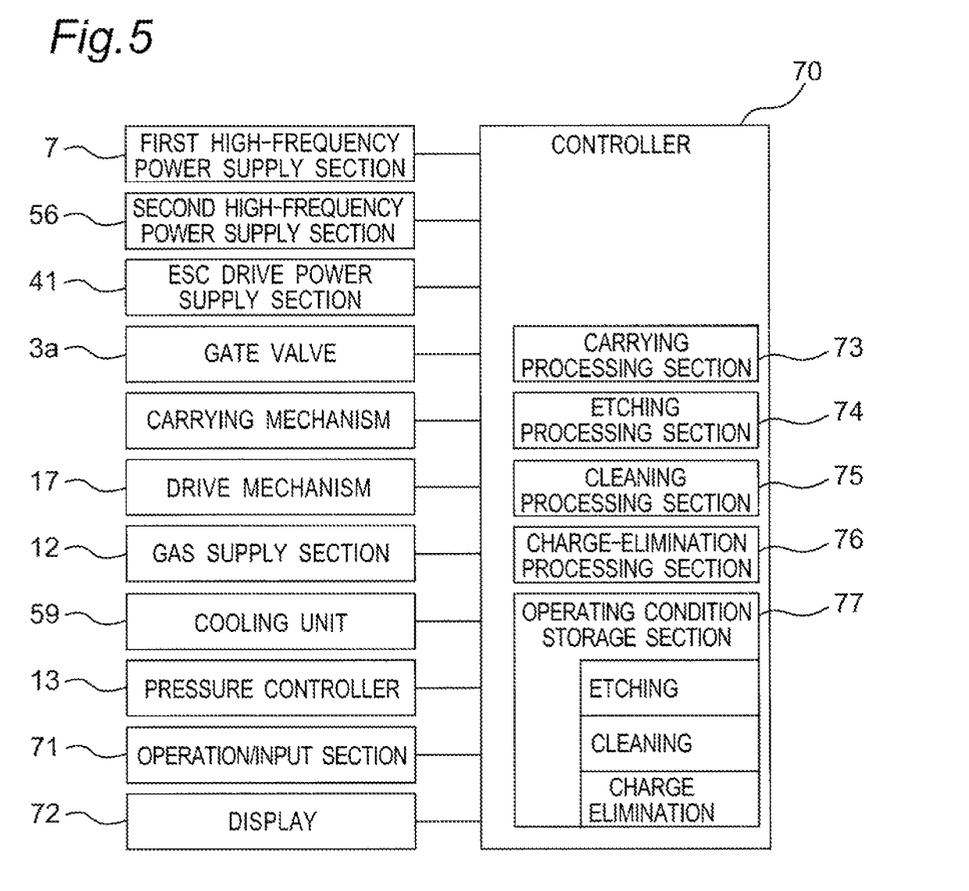
FIG. 5 is a block diagram showing main components of a controller included in the dry etching apparatus.

Next, a controller 70 included in the dry etching apparatus 1 is described in terms of its structure with reference to a block diagram shown in FIG. 5.

As shown in FIG. 5, operations of the first high-frequency power supply section 7, the second high-frequency power supply section 56, the ESC drive power supply section 41, the gate valve 3a, the carrying mechanism, the drive mechanism 17, the gas supply section 12, the cooling unit 59, and the pressure controller 13, which are constituent members of the dry etching apparatus 1, are administratively controlled by the controller 70 in association with operations of the other constituent members. Also, the controller 70 includes an operation/input section 71 for performing operation and input by an operator, and a display 72 for displaying operation information or the like in the dry etching apparatus 1.

In the dry etching apparatus 1 of this embodiment, for example, sapphire substrates are treated as the substrates 2, and processing for forming a minor concavo-convex structure on surfaces of the substrates 2 (PSS: Patterned Sapphire Substrate) is performed as the etching process (plasma processing). It is noted that the processing for forming a minor concavo-convex structure on the surfaces of the substrates 2 as shown above can be referred to also as surface roughening process or surface texture processing of substrate surfaces.

In the dry etching apparatus 1, in order to accomplish such etching process as shown above, preset programs are executed to fulfill the following processes sequentially: a tray carrying-in process (substrate carrying-in step (process) and substrate placement step) for carrying a plurality of substrates 2 held by the tray 15 into the chamber 3 and placing the substrates onto the substrate stage 9; an etching process (first plasma processing step) for performing PSS processing by etching process on the carried-in substrates 2; a cleaning process (second plasma processing step) for removing, by plasma processing, by-products having stuck to the substrates 2 and the tray 15 due to execution of the etching process; a charge elimination process (charge elimination step) for generating a charge-eliminating plasma to reduce residual electrostatic absorption force between the substrates 2 and the substrate holding portions 29; and a tray carrying-out process (substrate carrying-out step) for carrying the individual substrates 2 out, as the substrates are kept held by the tray 15, from within the chamber 3. For this purpose, the controller 70 includes, as processing sections made up of those programs and arithmetic units for executing the programs to execute various types of processes: a carrying processing section 73, an etching processing section 74, a cleaning processing section 75, and a charge-elimination processing section 76. Besides, an operating condition storage section 77 for storing various types of operating conditions for implementing etching process, cleaning process, and charge elimination process is included in the controller 70.

Next, a method for executing the etching process on a plurality of substrates 2 with use of the dry etching apparatus 1 having the above-described structure is explained with reference to the flowchart shown in FIG. 6. It is noted that the individual processes described hereinbelow are executed under control of the individual constituent sections performed based on the preset programs and operating conditions by the controller 70 included in the dry etching apparatus 1.

(Tray Carrying-in Process)

Figure 6:
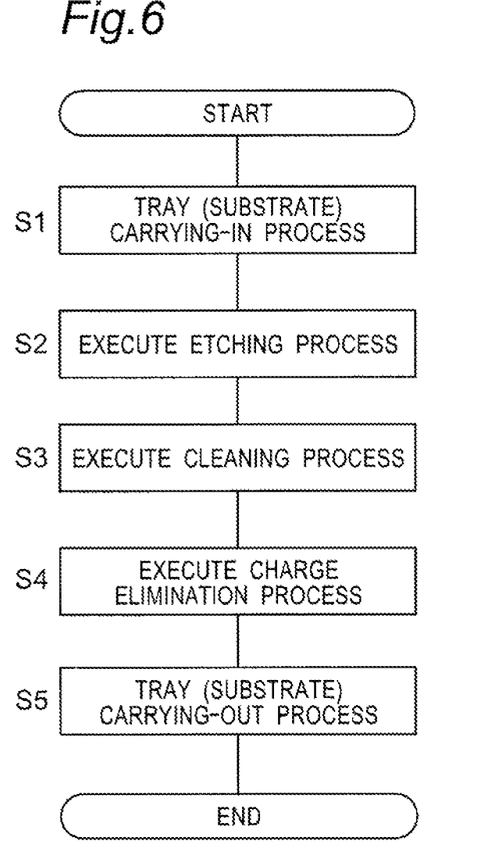
FIG. 6 is a flowchart showing a procedure of the etching process method of the embodiment.

First, a tray carrying-in process (step S1) in the flowchart of FIG. 6 is executed. More specifically, in the dry etching apparatus 1, the gate valve 3a is opened. Then, the tray 15, in which the substrates 2 are received by the four substrate receiving holes 19, respectively, is held by the hand portions of the carrying mechanism and carried, for example, from the load-lock chamber through the gate valve 3a into the chamber 3.

In the chamber 3, the tray pushing-up rods 18 driven by the drive mechanism 17 are moved up, so that the tray 15 is transferred from the hand portions to upper ends of the tray pushing-up rods 18. After the transfer of the tray 15, the hand portions are withdrawn into the load-lock chamber, with the gate valve 3a closed.

The tray pushing-up rods 18 with the tray 15 supported by their upper ends are moved down from their pushed-up positions to storage positions for storage within the substrate stage 9. The tray 15 has its lower surface 15c moved down to the tray support portion 28 of the stage upper portion 23 in the substrate stage 9, so that the tray 15 is supported by the tray support portion 28 of the stage upper portion 23. During the move-down of the tray 15 toward the tray support portion 28, the substrate holding portions 29 of the stage upper portion 23 enter into their corresponding substrate receiving holes 19, respectively, of the tray 15 from the lower surface 15c side of the tray 15. Before the lower surface 15c of the tray 15 makes contact with the tray support portion 28, the holding surface 31, which is an upper end face of each substrate holding portion 29, makes contact with the lower surface of the substrate 2. When the tray 15 is further moved down so that the lower surface 15c of the tray 15 is placed onto the tray support portion 28, the edge portion 2a of each substrate 2 is levitated from the upper surface 21a of the substrate support portion 21, with the result that the tray 15 and the substrate 2 are apart from each other. In addition, since the tray 15 is positioned for its placement position by the guide ring 30, the individual substrates 2 are placed with high positioning accuracy relative to the substrate holding portions 29, respectively.

Thereafter, the DC voltage is applied from the ESC drive power supply section 41 to the ESC electrode 40 contained in each substrate holding portion 29.

(Etching Process)

Next, etching process (step S2) is executed. More specifically, an etching-process gas is supplied from the gas supply section 12 into the chamber 3, while the inside of the chamber 3 is adjusted to a specified pressure by the pressure controller 13. Subsequently, a high-frequency voltage is applied from the first high-frequency power supply section 7 to the ICP coil 5. As a result, a plasma is generated in the chamber 3.

Also, due to the generation of the plasma in the chamber 3, electrostatic absorption force is generated between each substrate 2 and its substrate holding portion 29, so that the substrate 2 is electrostatically absorbed to the holding surface 31 of the substrate holding portion 29. The lower surface of the substrate 2 is placed directly on the holding surface 31 without interposition of the tray 15. Accordingly, the substrate 2 is held with a high degree of close contact to the holding surface 31. Thereafter, the cooling gas is supplied from the cooling-gas supply section 45 through the cooling-gas supply ports 44 into spaces between the holding surfaces 31 of the individual substrate holding portions 29 and the lower surfaces of the substrates 2, so that the cooling gas is filled in those spaces. With the cooling gas filled enough (kept at a specified pressure), a bias voltage is applied to the metal block 24 of the substrate stage 9 by the second high-frequency power supply section 56 so that the plasma generated in the chamber 3 is drawn up toward the substrate stage 9 side. Thus, the etching process for the substrates 2 is fulfilled, by which PSS processing for the surfaces of the substrates 2 is executed. Since four substrates 2 can be placed on the substrate stage 9 by one tray 15, a batch process is practicable.

During the etching process, in addition to the cooling by the cooling gas, a refrigerant is circulated in the refrigerant flow passages 60 by the cooling unit 59 to cool the metal block 24, by which the substrates 2 held by the stage upper portion 23 and the holding surfaces 31 are cooled. Therefore, temperature of the substrates 2 is securely controlled during the etching process. After elapse of a specified processing time, the application of the bias voltage to the metal block 24 of the substrate stage 9 by the second high-frequency power supply section 56 is stopped while the supply of the etching-process gas is stopped, thus the etching process for the substrates 2 being completed.

(Cleaning Process)

Figure 7:
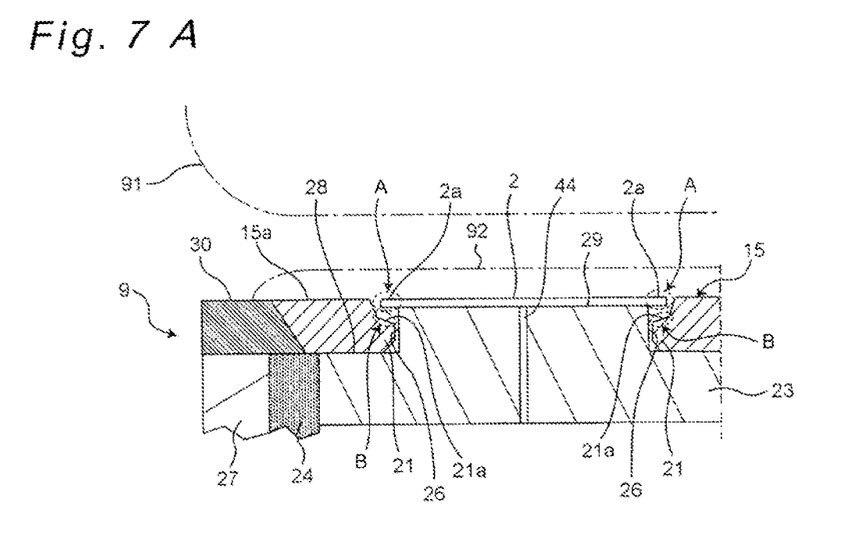
FIG. 7A is an explanatory view showing a deposit sticking state.
FIG. 7B is an explanatory view (exploded state) showing a deposit sticking state.

Now, a state of the substrate 2 and the tray 15 immediately after execution of such etching process as shown above is shown in the explanatory views of FIGS. 7A and 7B. As shown in FIG. 7A, with the tray 15 placed on the tray support portion 28 and with the substrates 2 held on the substrate holding portions 29, respectively, there is provided a clearance between the upper surface 21a of the substrate support portion 21 of the tray 15 and the lower surface of the edge portion 2a of each substrate 2 so that their contact with each other is prevented by the clearance. When the etching process is performed in such a state, deposits, which are by-products resulting from the etching process, are more liable to stick on the lower surfaces of the edge portions 2a of the substrates 2 as well as their vicinities (part A) and on the upper surface 21a of the substrate support portion 21 of the tray 15, which is hidden by the edge portions 2a of the substrates 2, as well as its vicinities (part B). In the figures, reference sign 91 denotes generated plasma, 92 denotes a sheath, and 93 denotes sticking deposits which are schematically shown.

In particular, in a mode in which a plurality of substrates 2 are supported and carried by using the tray 15, there is a need for making the edge portions 2a of the substrates 2 supported by the substrate support portions 21 of the tray 15, so that the edge portions 2a of the substrates 2 are protruded out of the outer-peripheral end portions of the substrate holding portions 29 in the state that the substrates 2 are placed on the holding portions 29, respectively. Further, with the edge portions 2a of the substrates 2 and the substrate support portions 21 of the tray 15 apart from each other, the etching process is carried out. Therefore, during the etching process, deposits 93 as by-products of etching process are more liable to stick and remain on the lower surfaces of the edge portions 2a of the substrates 2, the substrate support portions 21 of the tray 15 or the like, which are sites into which the generated plasma comparatively less easily penetrates. A process for removing the deposits 93 having stuck between the substrates 2 and the tray 15 as shown above is the succeeding-stage cleaning process.

After completion of the etching process and stop of both the application of the bias voltage and the supply of the etching-process gas, cleaning process is executed (step S3). More specifically, a cleaning-process gas different in type from the etching-process gas is supplied from the gas supply section 12 into the chamber 3 while the inside of the chamber 3 is adjusted to a specified pressure by the pressure controller 13. Subsequently, a high-frequency voltage is applied from the first high-frequency power supply section 7 to the ICP coil 5 so that a plasma is generated in the chamber 3. In this case, no bias voltage by the second high-frequency power supply section 56 is applied. By this plasma, deposits sticking at the edge portions 2a of the substrates 2 and the substrate support portions 21 of the tray 15 as well as at their vicinities are removed.

It is noted here that a side surface 26 of each substrate holding portion 29 is located on a deeper side of the clearance between the lower surfaces of the edge portions 2a of the substrates 2 and the substrate support portions 21 of the tray 15. Since this clearance is provided as a clearance of such a level that the lower surfaces of the edge portions 2a and the substrate support portions 21 are kept from contact with each other, the side surfaces 26 of the substrate holding portions 29 located on the deeper side of the clearance are less likely to be exposed to the plasma generated during the cleaning process. Therefore, large portions of deposits removed by the cleaning process can be stuck and accumulated to the side surfaces 26 of the substrate holding portions 29. Furthermore, repeating the cleaning process allows the deposits to be accumulated on and on. That is, the deposits removed by the cleaning process can be accumulated locally on the side surfaces 26. By utilizing such a deposit-accumulating function, efficient maintenance work can be fulfilled by performing, for example, wiping or the like emphatically on the side surfaces 26 during maintenance after continuous operations.

In this cleaning process, inside of the chamber 3 is adjusted to a pressure higher than a pressure for the etching process. By setting the internal space of the chamber 3 to such a high pressure shown above in the cleaning process, an isotropic property of the generated plasma can be enhanced, allowing the plasma to more easily penetrate into the clearance between the edge portions 2a of the substrates 2 and the substrate support portions 21 of the tray 15, so that sticking deposits can be removed effectively. Also, for an easier penetration of the generated plasma into the clearance, a bias voltage may be applied to the metal block 24 by the second high-frequency power supply section 56. In this case, the bias voltage applied during the cleaning process is desirably set lower than the bias voltage applied during the etching process.

Further, in the cleaning process, the DC voltage applied from the ESC drive power supply section 41 to the ESC electrodes 40 is desirably set lower than the DC voltage applied during the etching process. As described before, in the cleaning process, the isotropic property of the plasma is enhanced by enhancing the internal pressure of the chamber 3, for example. Therefore, as a result of penetration of the plasma into the clearance between the edge portions 2a of the substrates 2 and the substrate support portions 21 of the tray 15, large amounts of electrons are present in vicinities of the substrate holding portions 29. Meanwhile, a dielectric member for forming the stage upper portion 23 including the substrate holding portions 29 is provided by using low-resistance type ceramics (volume resistivity (25° C.): $10^{10}$-$10^{11}$ Ω·cm) to ensure the electrostatic absorption force at the holding surfaces 31 of the substrate holding portions 29. Therefore, in a case where a voltage equivalent to the voltage for the etching process is applied to the ESC electrodes 40 in the state that large amounts of electrons are present in vicinities of the substrate holding portions 29, there may occur a dielectric breakdown. Accordingly, for execution of the cleaning process, the DC voltage applied to the ESC electrodes 40 contained in the substrate holding portions 29 is set lower than the voltage applied for the etching process or equal to zero voltage, thereby preventing occurrence of a dielectric breakdown around the ESC electrodes 40.

Also, in the cleaning process, since the voltage applied to the ESC electrodes 40 is lowered as shown above, the electrostatic absorption force for the substrates 2 is lowered as well. Therefore, a differential pressure of the cooling gas supplied from the cooling-gas supply section 45 and charged between the substrates 2 and the substrate holding portions 29 in comparison to the internal pressure of the chamber is also set lower in correspondence to the level of the electrostatic absorption force or equal to zero irrespective of the level of the electrostatic absorption force, which means an interruption of the cooling gas supply.

Then, after elapse of a specified time, the application of the bias voltage to the metal block 24 of the substrate stage 9 by the second high-frequency power supply section 56 is stopped and moreover the supply of the cleaning-process gas is stopped, thus the cleaning process for the substrates 2 and the tray 15 is completed. In addition, it is most desirable that both the bias voltage and the cooling-gas pressure for the cleaning process are set to zero as their setting conditions.

(Charge Elimination Process)

Next, a charge elimination process for reducing the residual electrostatic absorption force is executed (step S4). More specifically, a charge-elimination-process gas (Ar, He or other inert gas, gases hardly contributing to etching such as $O_2$, etc.) different in type from the cleaning-process gas is supplied from the gas supply section 12 into the chamber 3, and moreover inside of the chamber 3 is adjusted to a specified pressure by the pressure controller 13. Also, application of the DC voltage to the ESC electrodes 40 by the ESC drive power supply section 41 is stopped. Subsequently, the high-frequency voltage is applied from the first high-frequency power supply section 7 to the ICP coil 5. In this case, the high-frequency voltage to be applied is set lower than the voltage applied for the cleaning process. In this state, electrostatic absorption force remaining between the substrates 2 and the substrate holding portions 29 is reduced by the plasma generated in the chamber 3. In addition, in a case where the cooling gas has been supplied in the cleaning process described before, supply of the cooling gas from the cooling-gas supply section 45 is stopped prior to the charge elimination process so that the cooling gas filled between the substrates 2 and the substrate holding portions 29 is drawn out in advance.

Then, after elapse of a specified time, the application of the high-frequency voltage to the ICP coil 5 by the first high-frequency power supply section 7 is stopped.

(Tray Carrying-Out Process)

Figure 8:
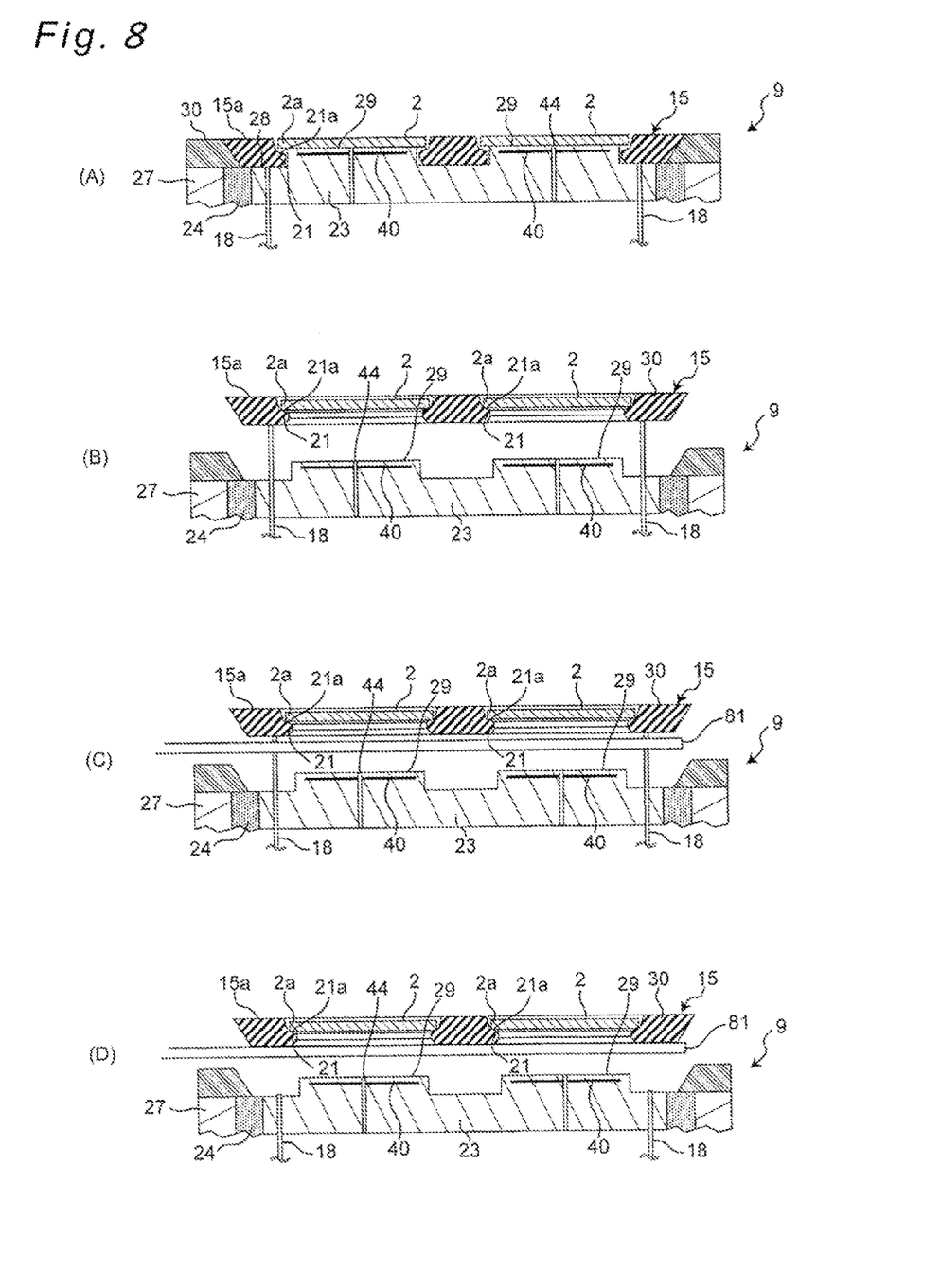
FIG. 8 includes operation explanatory views showing a procedure of a tray carrying-out process.

Subsequently, a tray carrying-out process for carrying the individual substrates 2 along with the tray 15 out of the chamber 3 is executed (step S5). More specifically, as shown in FIGS. 8(A) and (B), the individual tray pushing-up rods 18 are moved up by the drive mechanism 17. As the tray pushing-up rods 18 are moved up, the lower surface 15c of the tray 15 is pushed up by upper ends of the tray pushing-up rods 18, so that the tray 15 is levitated from the tray support portion 28 of the stage upper portion 23. As the tray 15 is further moved up along with the tray pushing-up rods 18, the substrate support portions 21 of the tray 15 and the lower surfaces of the edge portions 2a of the substrates 2 come into contact with each other as shown in FIG. 8(B), so that the individual substrates 2 are pushed up as they are supported by the tray 15, being levitated from the holding surfaces 31 of the substrate holding portions 29.

Thereafter, the gate valve 3a is opened and the hand portions 81 of the carrying mechanism are inserted into the chamber 3. Then, as shown in FIGS. 8(C) and (D), the tray 15, in which the substrates 2 are received by the four substrate receiving holes 19, respectively, is delivered from the tray pushing-up rods 18 to the hand portions 81, and the substrates 2 supported by the tray 15 are carried out through the gate valve 3a.

The operation of pushing up the tray 15 with the individual tray pushing-up rods 18 may also be executed concurrently while the charge elimination process is being performed with the charge-eliminating plasma.

According to the etching process method for the substrates 2 in this embodiment, in a mode in which a plurality of substrates 2 are carried by the tray 15 while the edge portions 2a of the substrates 2 are supported by the substrate support portions 21 of the tray 15, and in which etching process for the substrates 2 is performed while the edge portions 2a of the substrates 2 and the substrate support portions 21 of the tray 15 are apart from each other so as to be kept from their mutual contact, deposits, which are by-products having stuck to the edge portions 2a of the substrates 2 and the substrate support portions 21 of the tray 15 during the etching process of the substrates 2, can be removed effectively by using plasma generated by executing cleaning process subsequent to the etching process.

Thus, thereafter, when the plurality of substrates 2 are carried out from the chamber 3 as they are received by the tray 15 with the edge portions 2a of the substrates 2 supported again by the substrate support portions 21 of the tray 15, fall of deposits due to contact of the tray 15 and the substrates 2 with each other can be prevented. Accordingly, occurrence of trouble, such as occurrence of contamination in subsequent process due to fall of such deposits onto the substrate holding portions 29 or the like, can be avoided, so that product quality by the etching process method for substrates can be improved.

In particular, in such a mode in which the tray 15 is used for treatment of substrates 2, the clearance between the edge portions 2a of the substrates 2 and the substrate support portions 21 of the tray 15 is preferably set so as to be kept from penetration of generated plasma during execution of the etching process. Nevertheless, there is a need for allowing the generated plasma to be effectively penetrated into the clearance in order to remove the deposits having stuck to the edge portions 2a of the substrates 2 and the surfaces of the substrate support portions 21 of the tray 15 by execution of the cleaning process with the plasma penetrated into the clearance. In this embodiment, by enhancing the isotropic property of the plasma generated in the cleaning process, the removal of sticking deposits can be fulfilled by making the plasma effectively penetrate into the clearance.

In addition, in order to prevent penetration of the plasma to the lower surface side of the substrates 2 during the etching process, preferably, a clearance between the edge portion 2a of each substrate 2 and the inner wall 15d of the substrate receiving hole 19 of the tray 15 is about 0.1-0.2 mm, a clearance between the lower surface of the edge portion 2a of each substrate 2 and the upper surface of the substrate support portion 21 of the tray 15 is about 0.2-0.3 mm, and a clearance between the side wall of each substrate holding portion 29 and an end (inner-wall end) of the substrate support portion 21 is about 0.5 mm.

Also, in the etching process method of this embodiment, for processing with sapphire substrates used as the substrates 2, operating conditions for individual processes can be set as shown below. These operating conditions are previously stored in the operating condition storage section 77 of the controller 70. It is noted that these operating conditions are only an example and may be set to optimum ones depending on types of the substrates to be processed, contents of processing, or the like:

Etching process:
Process gas type, flow rate: $BCl_3$, 200 cc
Process pressure: 0.6 Pa
ICP coil application power: 1400 W
Bias: 1600 W
Applied voltage for ESC electrodes: 2.0 kV
Cooling-gas pressure: 2.0 kPa
Processing time: 10 min.
Cleaning process:
Process gas type, flow rate: $O_2$, 200 cc/$CF_4$, 200 cc
Process pressure: 8.0 Pa
ICP coil application power: 1800 W
Bias: 0 W
Applied voltage for ESC electrodes: 1.0 kV
Cooling-gas pressure: 1.0 kPa
Processing time: 2 min.
Charge elimination process:
Process gas type, flow rate: Ar, 200 cc
Process pressure: 8.0 Pa
ICP coil application power: 200 W
Bias: 0 W
Applied voltage for ESC electrodes: 0 kV
Cooling-gas pressure: 0 kPa
Processing time: 10 sec.

Since the side surfaces 26 of the substrate holding portions 29 are less exposed to the plasma of the cleaning process depending on the clearance between the lower surfaces of the edge portions 2a of the substrates 2 and the substrate support portions 21 of the tray 15, most of deposits removed by the cleaning process can be stuck and deposited on the side surfaces 26. That is, the deposits removed by the cleaning process can be accumulated locally on the side surfaces 26. By utilizing such a deposit-accumulating function, efficient maintenance work can be fulfilled by performing, for example, wiping or the like emphatically on the side surfaces 26 during maintenance after continuous operations.

Now, some modifications that more effectively utilize the deposit-accumulating effect onto the side surfaces 26 by execution of the cleaning process are described with reference to FIGS. 9 and 10.

(Modification 1)

Figure 9:
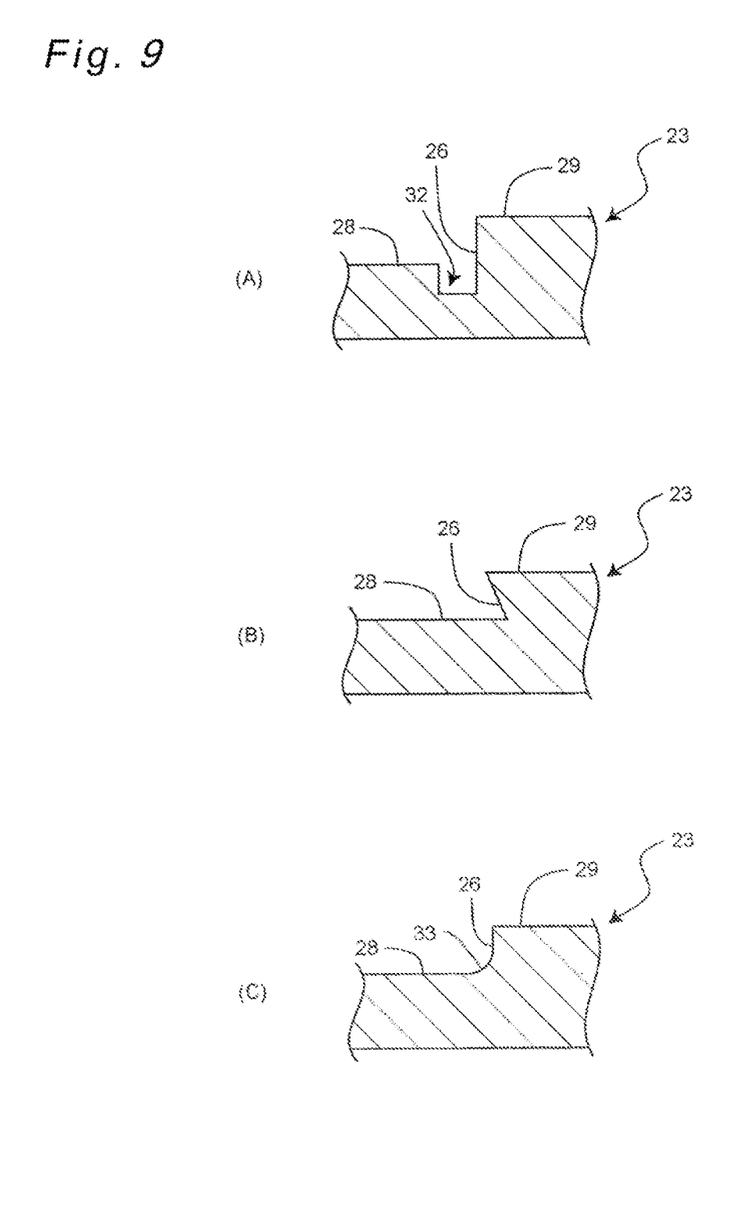
FIG. 9 is a partial sectional view showing a vicinity of a side surface of the substrate holding portion according to a Modification 1 of the invention.
Figure 10:
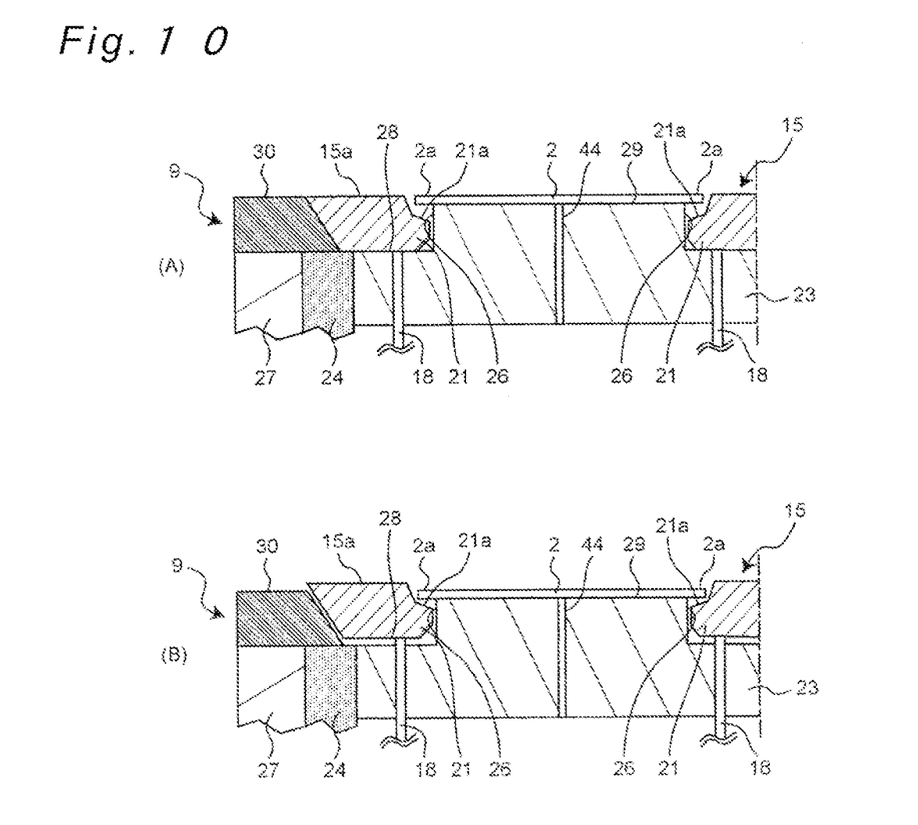
FIG. 10 includes explanatory views showing operation of the tray during a cleaning process according to a Modification 2 of the invention.

FIG. 9 is a partial sectional view showing a vicinity of a side surface 26 of the substrate holding portion 29 in the stage upper portion 23 according to Modification 1. As shown in FIG. 9(A), an annular groove 32 is formed on the outer periphery of the substrate holding portion 29. In such a structure, the area of the side surface 26 can be enlarged by the formation of the groove 32, even larger amounts of deposits can be stuck and deposited on the side surfaces 26. Thus, the maintenance work can be fulfilled more efficiently.

The structure that increases the side surface area is not limited to that of FIG. 9(A). For example, as shown in FIG. 9(B), the side surface 26 may be formed as an inclined surface. Also, the inclined surface in this case may be inclined in any direction.

Otherwise, with a view to smoothly fulfilling deposit-wiping work after the accumulation of deposits, a curved surface portion 33 may be formed at a boundary portion between the side surface 26 and the tray support portion 28 as shown in FIG. 9(C).

(Modification 2)

The foregoing embodiment has been described on a case where the cleaning process is executed while the tray 15 is placed on the tray support portion 28, as an example. However, as shown in FIGS. 10(A) and (B), it is also allowable that during the cleaning process, a thrusting-up operation of the tray 15 is effected by the tray pushing-up rods 18 so that the tray 15 is set apart from the tray support portion 28. By performing the thrusting-up operation during the cleaning process as shown above, it becomes possible to control the size of the clearance between the lower surfaces of the edge portions 2a of the substrates 2 and the substrate support portions 21 of the tray 15 in view of balance between the cleaning effect and the deposit-accumulation effect by re-sticking of deposits to the side surfaces 26, so that efficient cleaning process can be fulfilled.

Further, the present invention is not limited to the above-described structure and may be carried out in other various modes. For example, the etching process method of this embodiment is applicable also to silicon substrates instead of sapphire substrates.

Furthermore, the etching process method of this embodiment is applicable also to quadrilateral-shaped substrates instead of disc-shaped substrates. Such quadrilateral-shaped substrates are exemplified by solar-light panel substrates as an example. In solar-light panel substrates, a minor concavo-convex structure is formed on substrate surfaces by etching process or surface texture processing for efficient absorption of solar light, and in common to sapphire substrates, the pit-and-bump structure is formed by etching process. Also, in such solar-light panel substrates, which are, in many cases, formed from silicon-base materials, the carrying of substrates by using a tray is adopted.

Also, the above-described structure has been explained on a case where the entire periphery of an edge portion 2a of the substrate 2 is supported by the substrate support portion 21 formed over the entire periphery of the inner wall of each substrate receiving hole 19 of the tray 15. However, it is also allowable to adopt a structure in which the substrate support portion 21 is formed for part of the inner wall of each substrate receiving hole 19 while the edge portion 2a of each substrate 2 is supported by part of its outer periphery.

Further, it is also allowable that execution of the charge elimination process is inhibited in cases of lower electrostatic absorption force remaining between the substrates 2 and the substrate holding portions 29 or other like cases.

Further, it is also allowable that after successive execution of the etching process method of this embodiment for a plurality of trays 15, the cleaning process is executed with no tray 15 placed in the chamber 3, so that deposits sticking in the chamber 3 are removed.

Moreover, it is also allowable that the side wall of each substrate holding portion 29 is formed so as to be inclined, making deposits less easily stuck thereto.

It is to be noted that, by properly combining the arbitrary embodiments of the aforementioned various embodiments, the effects possessed by them can be produced.

The present invention is useful for methods of performing plasma processing on a plurality of substrates that are carried as they are received by a tray, and applicable particularly to such a method including a surface roughening process or surface texture processing of substrates in which a minor concavo-convex structure is formed on the substrate surface.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The entire disclosure of Japanese Patent Applications No. 2010-228621 filed on Oct. 8, 2010 and No. 2011-014335 filed on Jan. 26, 2011, including specification, claims, drawings, and summary are incorporated herein by reference in its entirety.

The invention claimed is:

1. A plasma processing method, comprising:
   carrying substrates into a chamber using a tray, wherein the tray has a plurality of substrate receiving holes that receive and carry the substrates, respectively, and wherein the substrate receiving holes have substrate support portions which protrude from inner walls of the substrate receiving holes and which support edge portions of the substrates;
   placing the tray onto a tray support portion of a substrate stage in the chamber and placing the substrates onto respective substrate holding portions protruding upwardly from the tray support portion so that the edge portions of the substrates, projecting beyond end edges of the substrate holding portions, are apart from the substrate support portions;
   first plasma processing comprising absorbing and holding the substrates on the substrate holding portions by electrostatic absorption using a first electrostatic absorption drive voltage, supplying a process gas into the chamber, adjusting internal pressure of the chamber and, while cooling the substrates with a cooling gas that is supplied at a specified pressure to between the substrates and the substrate holding portions, performing plasma processing for the substrates;
   second plasma processing comprising, after said first plasma processing and with the tray and the individual substrates placed on the substrate stage, holding the substrates on the substrate holding portions by electrostatic absorption by changing to a second electrostatic absorption drive voltage that is lower than the first electrostatic absorption drive voltage used in said first plasma processing, supplying a process gas into the chamber, adjusting the internal pressure of the chamber and performing plasma processing so as to remove by-products from said first plasma processing that are stuck to the edge portions of the substrates and the substrate support portions; and
   after completion of said second plasma processing, carrying the tray with the substrates out of the chamber while supporting the substrates with the substrate support portions.

2. The plasma processing method as claimed in claim 1, wherein after completion of said first plasma processing, process gas is changed over to a process gas different in type from the process gas of said first plasma processing in execution of said second plasma processing, and said second plasma processing is performed with a pressure higher than the pressure of the first plasma processing process.

3. The plasma processing method for substrates as claimed in claim 1, wherein in execution of said second plasma processing, a process-gas pressure is lower than the cooling gas pressure of said first plasma processing.

4. The plasma processing method for substrates as claimed in claim 3, wherein the second electrostatic absorption drive voltage used during said second plasma processing, and a differential pressure between the internal pressure of the chamber and the cooling-gas pressure in the second plasma processing process, are equal to zero.

5. The plasma processing method for substrates as claimed in claim 1, wherein sapphire substrates are used as the substrates, and said first plasma processing comprises forming a minor concavo-convex structure on surfaces of the sapphire substrates with said plasma processing.

6. The plasma processing method for substrates as claimed in claim 5, wherein
   $BCl_3$ is used as the process gas in said first plasma processing, and
   $O_2/CF_4$ is used as the process gas in said second plasma processing.

7. The plasma processing method for substrates as claimed in claim 1, wherein after completion of said second plasma processing, a charge-eliminating plasma is generated and a charge elimination process reducing residual electrostatic absorption force between the substrates and the substrate holding portions is executed.

8. The plasma processing method for substrates as claimed in claim 1, wherein by-products removed in the second plasma processing process are accumulated on side surfaces of the substrate holding portions.

* * * * *